(12) United States Patent
Novotny

(10) Patent No.: US 6,362,542 B1
(45) Date of Patent: *Mar. 26, 2002

(54) PIEZOELECTRIC MICROACTUATOR FOR PRECISE HEAD POSITIONING

(75) Inventor: Vlad Joseph Novotny, Los Gatos, CA (US)

(73) Assignee: Seagate Technology LLC, Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/007,007

(22) Filed: Jan. 14, 1998

Related U.S. Application Data

(60) Provisional application No. 60/055,874, filed on Aug. 15, 1997.

(51) Int. Cl.$^7$ ............................................... H02K 41/00
(52) U.S. Cl. .................... 310/12; 310/328; 310/332; 360/104; 360/106; 360/109
(58) Field of Search ................... 310/328, 330–332; 360/103, 106, 109, 104

(56) References Cited

U.S. PATENT DOCUMENTS

| 3,524,196 A | * | 8/1970 | Church et al. | 310/328 |
| 3,903,435 A | * | 9/1975 | Bouygues et al. | 310/328 |

(List continued on next page.)

FOREIGN PATENT DOCUMENTS

| EP | 0412221 B1 | | 2/1991 | | |
| JP | 0051885 | * | 5/1986 | | 310/332 |
| JP | 0091979 | * | 5/1986 | | 310/332 |
| JP | 0250681 | * | 10/1987 | | 310/332 |
| JP | 02-263369 | | 10/1990 | | |
| JP | 4-134681 | | 5/1992 | | |
| JP | 05-094682 | | 4/1993 | | |
| JP | 07-085621 | | 3/1995 | | |
| JP | 63-0122069 | | 5/1998 | | |

OTHER PUBLICATIONS

"Silicon Micromachined Electromagnetic Microactuators for Rigid Disk Drives" by Tang et al., *IEEE Transactions on Magnetics*, vol. 31, No. 6, Nov. 1995.

"Magnetic Recording Head Positioning at Very High Track Densities Using a Microactuator-Based, Two-Stage Servo System" by Fan et al., *IEEE Transactions on Industrial Electronics*, vol. 42, No. 3, Jun. 1995.

(List continued on next page.)

Primary Examiner—Mark O. Budd
(74) Attorney, Agent, or Firm—Derek J. Berger; Jonathan E. Olson; Shawn B. Dempster

(57) ABSTRACT

A slider assembly for selectively altering a position of a transducing head with respect to a track of a rotatable disc having a plurality of concentric tracks includes a slider body having a main portion and a head portion separated by a gap. The head portion carries the transducing head. The slider body is arranged to be supported by a support structure over a surface of the rotatable disc. A pair of structural elements are disposed on opposite side surfaces of the slider body between the main portion and the head portion across the gap. At least one of the structural elements is a microactuator responsive to electrical control signals to selectively bend to alter the position of the head portion with respect to the main portion of the slider body. The structural elements may be complementary microactuators. The microactuators may be formed by a process involving forming the microactuators on a slider substrate or on a row of sliders, forming the microactuators on a slider stack, or separately forming the microactuators and attaching the microactuators to a slider stack.

13 Claims, 11 Drawing Sheets

U.S. PATENT DOCUMENTS

| | | | |
|---|---|---|---|
| 4,233,637 A | * 11/1980 | Kubota | 310/332 X |
| 4,237,399 A | * 12/1980 | Sakamoto | 310/332 X |
| 4,374,402 A | 2/1983 | Blessom et al. | |
| 4,431,934 A | * 2/1984 | Kleinschmidt et al. | 310/328 X |
| 4,443,729 A | * 4/1984 | Rider | 310/330 |
| 4,489,352 A | * 12/1984 | Kobayashi et al. | 310/332 X |
| 4,594,526 A | * 6/1986 | Araki et al. | 310/332 X |
| 4,605,977 A | 8/1986 | Matthews | |
| 4,651,242 A | 3/1987 | Hirano et al. | |
| 4,669,011 A | 5/1987 | Lemke | |
| 4,686,440 A | * 8/1987 | Hatamura et al. | 310/328 X |
| 4,689,514 A | * 8/1987 | Kondoh et al. | 310/332 X |
| 4,764,829 A | 8/1988 | Makino | |
| 4,798,989 A | * 1/1989 | Miyazaki et al. | 310/328 |
| 4,853,810 A | 8/1989 | Pohl et al. | |
| 5,021,906 A | 6/1991 | Chang et al. | |
| 5,105,408 A | 4/1992 | Lee et al. | 369/44.15 |
| 5,189,578 A | 2/1993 | Mori et al. | 360/106 |
| 5,276,573 A | 1/1994 | Harada et al. | 360/103 |
| 5,303,105 A | 4/1994 | Jorgenson | |
| 5,521,778 A | 5/1996 | Boutaghou et al. | |
| 5,657,188 A | 8/1997 | Jurgenson et al. | 360/106 |
| 5,745,319 A | 4/1998 | Takekado et al. | |
| 5,764,444 A | 6/1998 | Imamura et al. | |
| 5,781,381 A | 7/1998 | Koganezawa et al. | |
| 5,793,571 A | 8/1998 | Jurgenson et al. | |
| 5,796,558 A | 8/1998 | Hanrahan et al. | |
| 5,867,347 A | 2/1999 | Knight et al. | |
| 5,896,246 A | 4/1999 | Budde et al. | |
| 5,898,541 A | 4/1999 | Boutaghoue et al. | |
| 5,898,544 A | 4/1999 | Krinke et al. | |

OTHER PUBLICATIONS

"A Flexural Piggyback Milli–Actuator for Over 5 Gbit/in.$^2$ Density Magnetic Recording", by Koganezawa et al., *IEEE Transactions on Magnetics*, vol. 32, No. 3, Sep. 1996.

"Transverse Mode Electrostatic Microacturator for MEMS–Based HDD Slider", by Imamura et al., *IEEE Jun. 1996*.

"An Experiment for Head Positioning System Using Sub–micron Track–width GMR Head", by Yoshikawa et al., *IEEE Transactions on Magnetics*, vol. 32, No. 5, Sep. 1996.

"Micro Electrostatic Actuators in Dual–Stage Disk Drives with High Track ensity" by Tang et al., *IEEE Transactions on Magnetics*. vol. 32, No. 5, Sep. 1996.

"Piezoelectric Microactuator Compensating for Off–Track Errors in Magnetic Disk Drives" by Imamura et al., *1993 American Society of Mechanical Engineers*, vol. 5, 1993.

"A Dual–Stage Magnetic Disk Drive Actuator Using a Piezoelectric Device for a High Track Density", by Mori et al., *IEEE Transactions on Magnetics*, vol. 27, No. 5, Nov. 1991.

"Dynamic Loading Criteria for 3½inch Inline HDD Using Multilayer Piezoelectric Load–Unload Mechanism", by Kajitani et al., *IEEE Trnasactions on Magnetics*, vol. 27, No. 6, Nov. 1991.

* cited by examiner

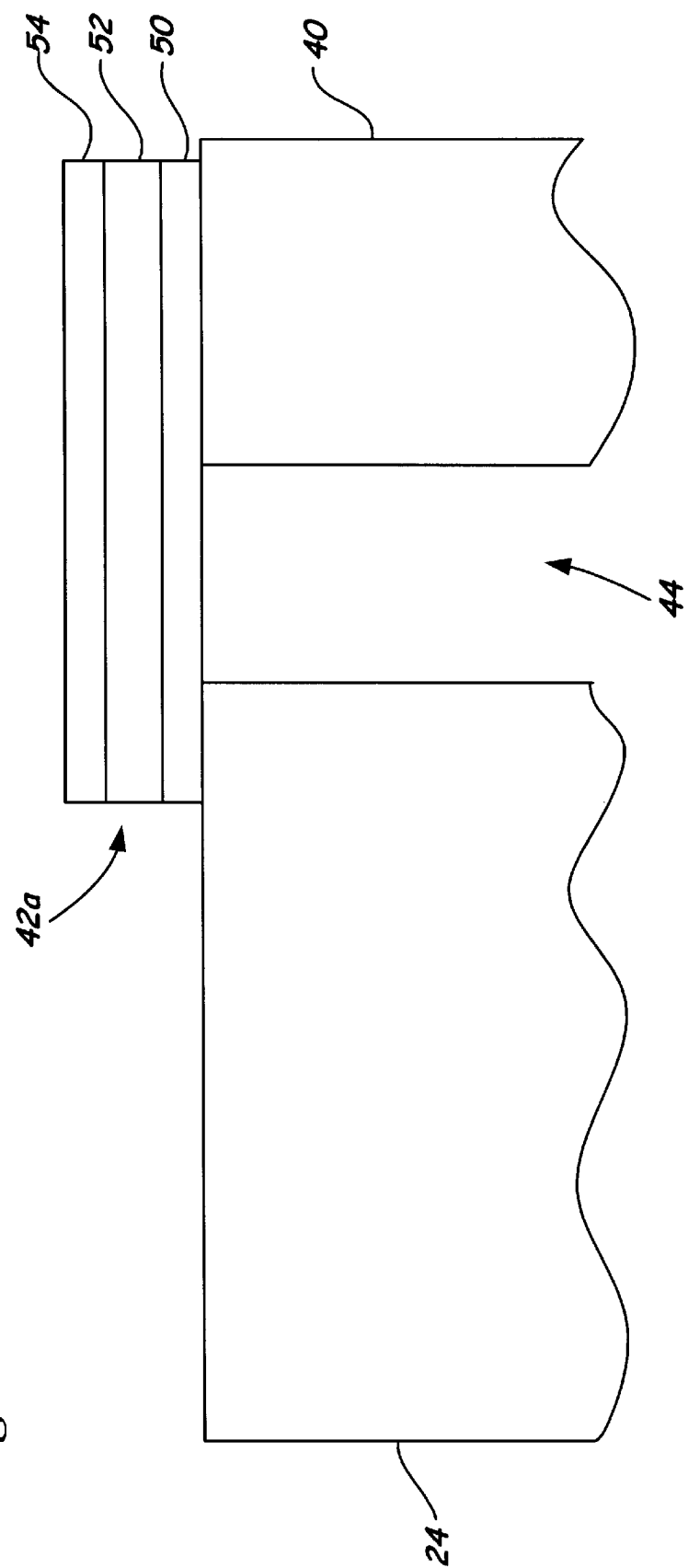

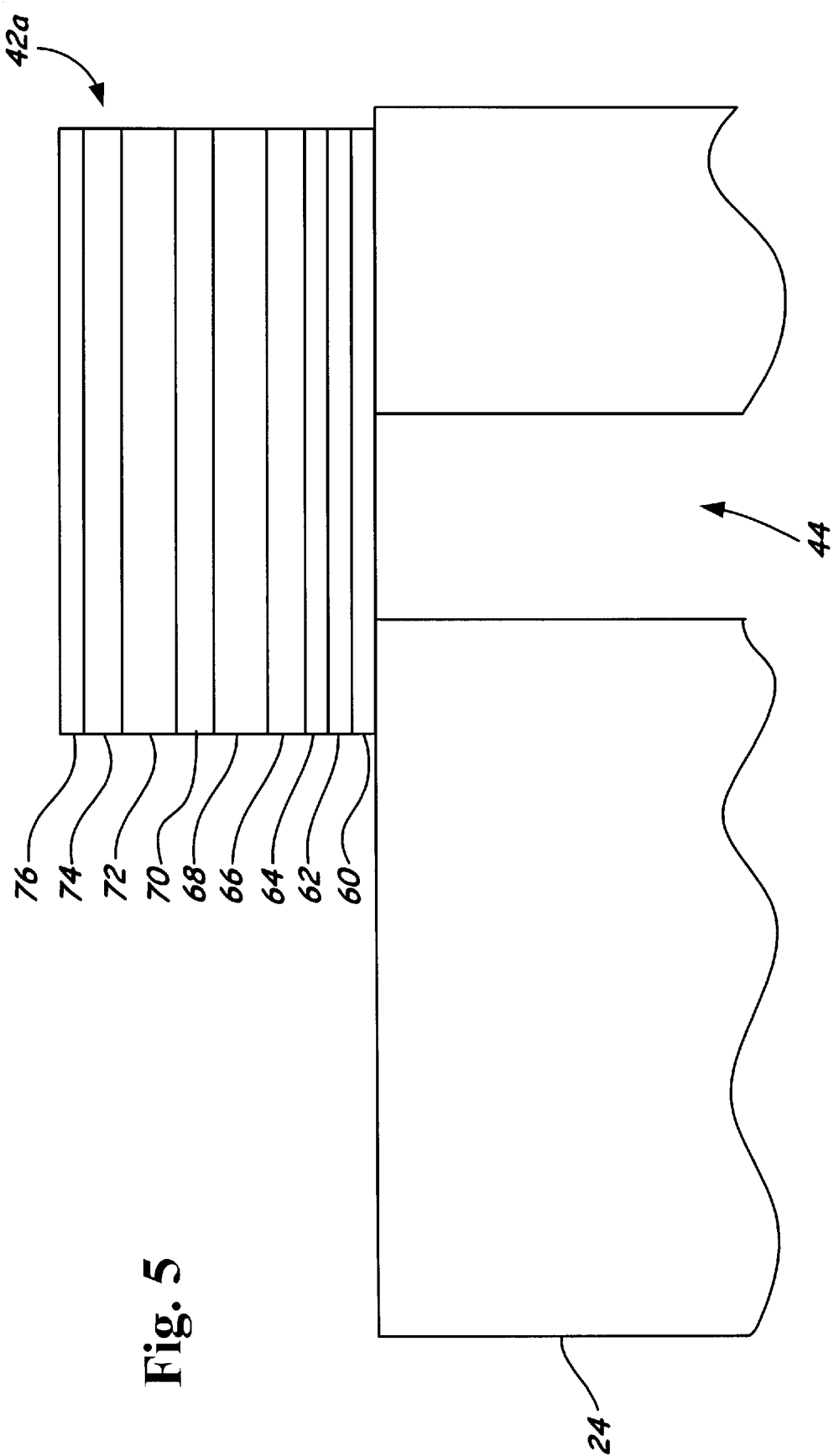

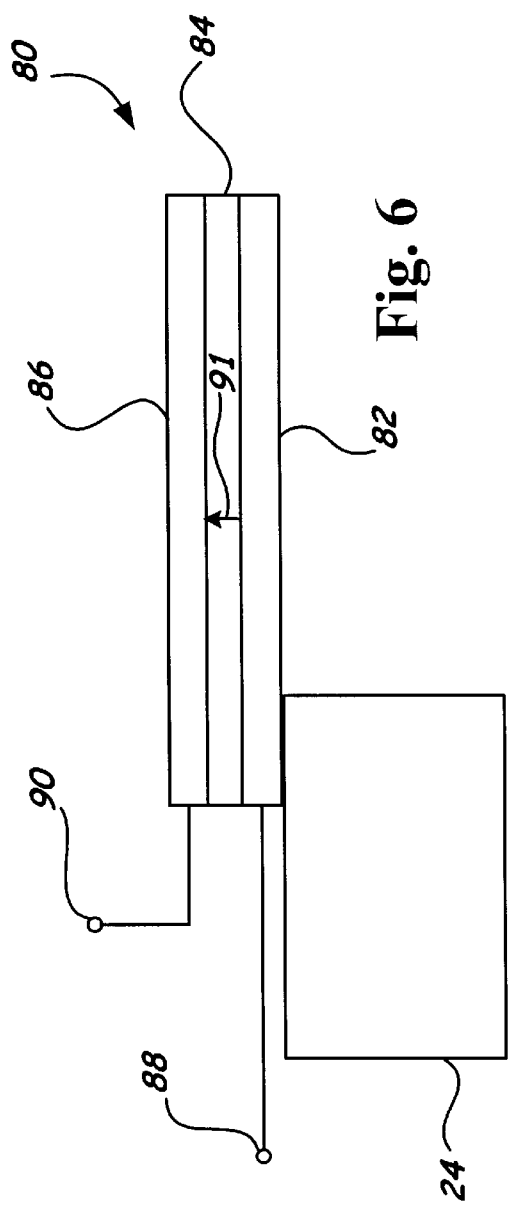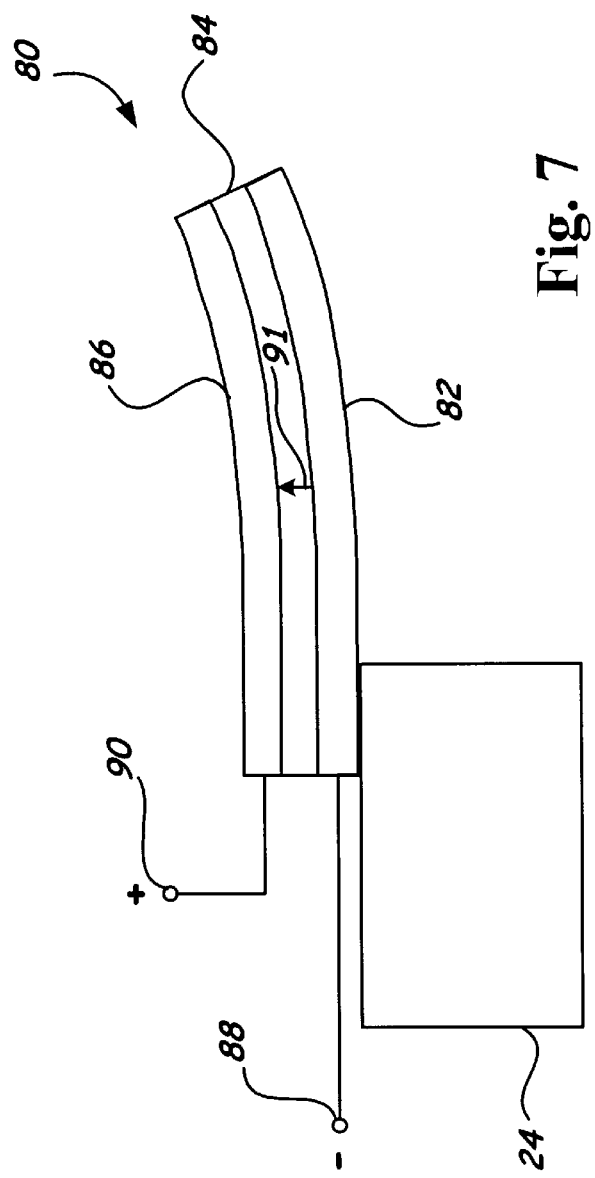

PIEZOELECTRIC MICROACTUATOR FOR PRECISE HEAD POSITIONING

CROSS-REFERENCE TO RELATED APPLICATION(S)

This application claims priority from Provisional Application No. 60/055,874 filed Aug. 15, 1997 for "Piezoelectric Head Moving Microactuator For Ultrahigh Track Density Magnetic Recording Drives" by V. Novotny.

BACKGROUND OF THE INVENTION

The present invention relates to a disc drive microactuator, and more particularly to a high resolution head positioning mechanism having one or more piezoelectric elements attached to a slider as a bendable cantilever for selectively moving a head portion of the slider radially with respect to circumferential data tracks of a rotatable disc.

The track density, or radial spacing, between concentric data tracks on magnetic discs continues to increase, requiring greater precision in head positioning. Conventionally, head positioning is accomplished by operating an actuator arm with a large-scale actuator motor, such as a voice coil motor, to position a head on a flexure at the end of the actuator arm. The large-scale motor lacks sufficient resolution and bandwidth to effectively accommodate high track-density discs. Thus, a high resolution head positioning mechanism is necessary to accommodate the more densely spaced tracks.

One promising design for high resolution head positioning involves employing a high resolution microactuator in addition to the conventional low resolution actuator motor, thereby effecting head positioning through dual-stage actuation. Various microactuator designs have been considered to accomplish high resolution head positioning, including piezoelectric, electromagnetic, electrostatic, capacitive, fluidic, and thermal actuators. Various locations for the microactuator have been suggested, including on the slider, on the gimbal, at the interface between the gimbal and the slider, and on the actuator arm, for example. However, the previous designs all had shortcomings that limited the effectiveness of the microactuator, such as substantial performance limitations or manufacturing complexities, which made the microactuator designs impractical. An effective microactuator design must provide high acceleration in positioning the head while also generating sufficiently large and accurate displacements to precisely move the head across several data tracks on the disc.

There is a need in the art for a microactuator design to provide high resolution head positioning with superior bandwidth performance characteristics that can be implemented by simple and readily available manufacturing processes.

BRIEF SUMMARY OF THE INVENTION

The present invention is a slider assembly for selectively altering a position of a transducing head with respect to a track of a rotatable disc having a plurality of concentric tracks. The slider assembly includes a slider body having a main portion and a head portion separated by a gap. The head portion carries the transducing head. The slider body is arranged to be supported by a support structure over a surface of the rotatable disc. A pair of structural elements are disposed on opposite side surfaces of the slider body between the main portion and the head portion across the gap. At least one of the structural elements is a microactuator responsive to electrical control signals to selectively bend to alter the position of the head portion with respect to the main portion of the slider body. The structural elements are preferably complementary microactuators.

Another aspect of the present invention is a process of forming a pair of microactuators on each of a plurality of sliders. A slider substrate is formed comprising main portions of the sliders, and a sacrificial layer is deposited on the slider substrate. Head portions each carrying a transducing head are then formed on the sacrificial layer. A row of sliders is separated from the slider substrate, an air-bearing surface is formed on each of the sliders in the row, and notches are cut between individual sliders in the row. Microactuators are formed between the main portions and the head portions of the sliders on side surfaces of the sliders in the notches. Alternatively, the microactuator processing may be performed at the wafer level, prior to the steps of separating the slider substrate into rows and defining the air-bearing surfaces of the sliders in the rows. Individual sliders are separated from the slider row such that a pair of microactuators are on opposite side surfaces of each of the sliders. The sacrificial layer is removed to form a gap between the main portions and the head portions of the sliders.

A further aspect of the present invention is a process of forming a microactuator on each of a plurality of sliders. A slider substrate is formed comprising main portions of the sliders, and a sacrificial layer is deposited on the slider substrate. Head portions each carrying a transducing head are then formed on the sacrificial layer. A row of sliders is separated from the slider substrate, and an air-bearing surface is shaped for each of the sliders in the row. Individual sliders are separated from the row of sliders, and a plurality of the individual sliders are glued together to form a slider stack. A plurality of microactuators are formed on side surfaces of each of the sliders in the slider stack, and the sacrificial layer is etched away to form a gap between the main portions and head portions of each of the sliders. The sliders are separated from each other by dissolving the glue. Alternatively, the plurality of microactuators may be separately formed and attached to the side surfaces of the sliders stack, and then separated into individual microactuators for each of the sliders in the slider stack.

BRIEF DESCRIPTION OF THE DRAWINGS

FIG. 4 is an enlarged top view of a portion of the slider shown in FIG. 2 illustrating the construction of the piezoelectric microactuator according to a first embodiment of the present invention.

FIG. 5 is an enlarged top view of a portion of the slider shown in FIG. 2 illustrating the construction of the piezoelectric microactuator according to a second embodiment of the present invention.

FIG. 6 is a diagram illustrating a unimorph piezoelectric bending motor in its neutral position.

FIG. 7 is a diagram illustrating the unimorph piezoelectric bending motor of FIG. 6 in its actuated position.

DETAILED DESCRIPTION OF THE PREFERRED EMBODIMENTS

Figure 1:
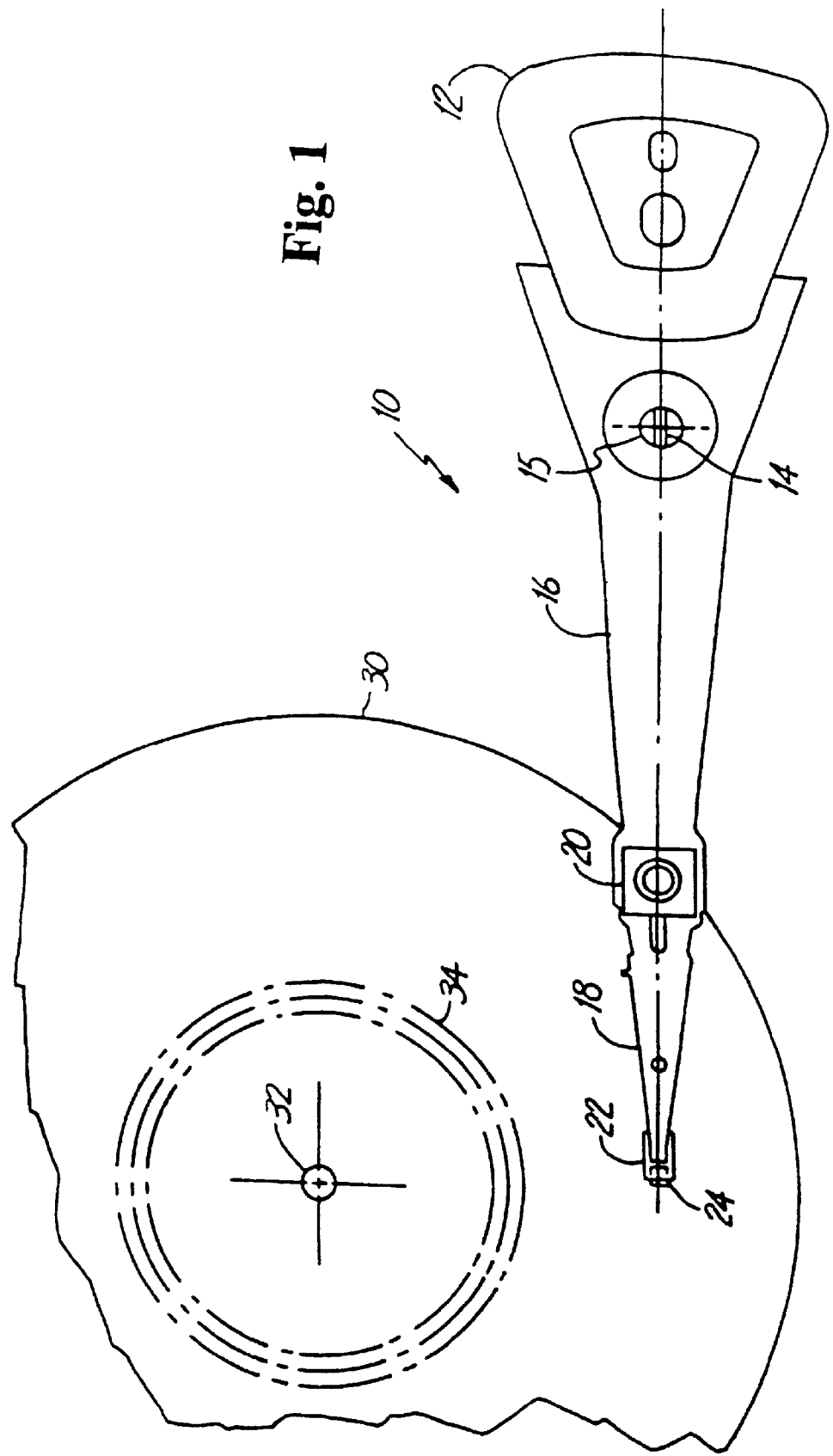
FIG. 1 is a top view of a disc drive actuation system for positioning a slider over tracks of a disc.

FIG. 1 is a top view of a disc drive actuation system 10 for positioning slider 24 over a track 34 of disc 30. Actuation system 10 includes voice coil motor (VCM) 12 arranged to rotate actuator arm 16 around axis 14. Head suspension 18 is connected to actuator arm 16 at head mounting block 20. Flexure 22 is connected to an end of head suspension 18, and carries slider 24. Slider 24 carries a transducing head (not shown in FIG. 1) for reading and/or writing data on concentric tracks 34 of disc 30. Disc 30 rotates around axis 32, so that windage is encountered by slider 24 to keep it aloft a small distance above the surface of disc 30.

VCM 12 is selectively operated to move actuator arm 16 around axis 14, thereby moving slider 24 between tracks 34 of disc 30. However, for disc drive systems with high track density, VCM 12 lacks sufficient resolution and frequency response to position a transducing head on slider 24 over a selected track 34 of disc 30. Therefore, a higher resolution actuation device is necessary.

Figure 2:
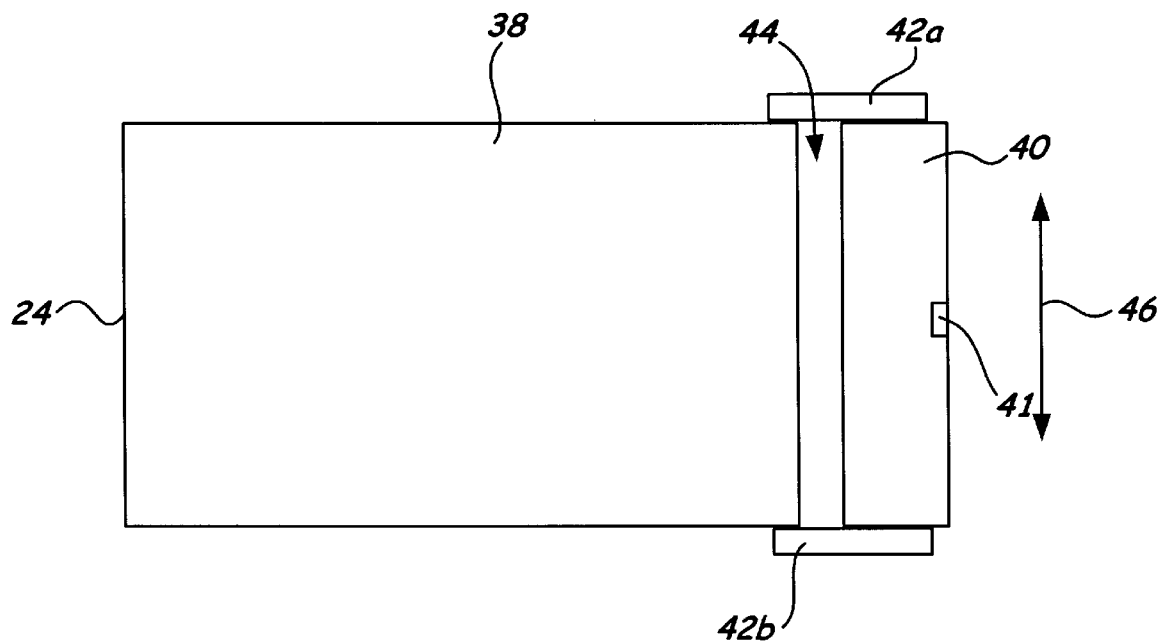
FIG. 2 is a top view of a slider including piezoelectric microactuators for high resolution head positioning according to the present invention.
Figure 3:
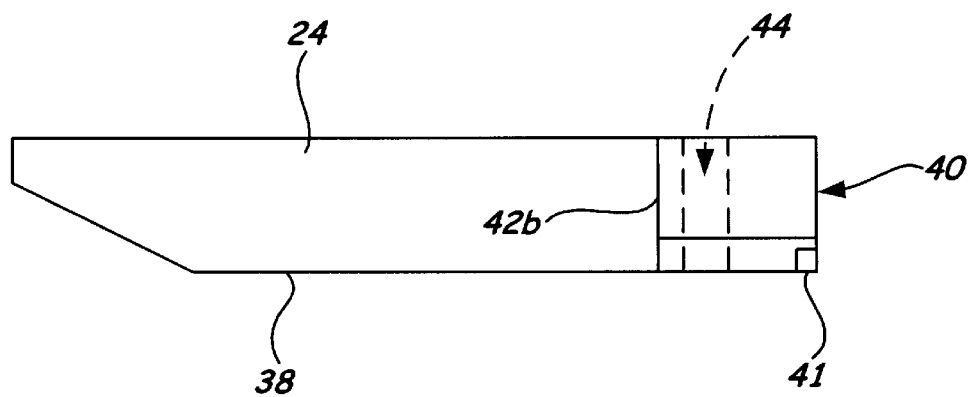
FIG. 3 is a side view of the slider shown in FIG. 2.

FIG. 2 is a top view and FIG. 3 is a side view of slider 24 including piezoelectric microactuator 42a and structural element 42b to enable high resolution positioning of head 41 according to the present invention. Slider 24 includes a head portion 40 carrying transducing head 41 and also includes air gap or space 44 between head portion 40 of slider 24 and the remaining portion of slider 24. Microactuator 42a and structural element 42b are disposed on the side surfaces of slider 24 near its distal end, connecting head portion 40 to the remainder of slider 24. Microactuator 42a is a structural element operable as a bendable cantilever to alter the position of head portion 40 with respect to main portion 38. Structural element 42b is preferably a microactuator similar and complementary to microactuator 42a, but may alternatively be a layer of structural material such as silicon nitride ($Si_3N_4$) or polysilicon, for example, to provide some flexibility while prevent undesired vibrations that could affect the position of transducing head 41. Transducing head 41 comprises an inductive write head and/or a magnetoresistive read head, for example, as is well known in the art. Transducing head 41 is desirably positioned directly over a data track on a rotating disc to read and/or write data from and/or to the disc.

In operation, slider 24 is coarsely positioned adjacent a selected data track by activating VCM 12 to move actuator arm 16 (FIG. 1) carrying slider 24. To finely position transducing head 41 over the selected track, control signals are applied to piezoelectric microactuator 42a to cause bending of microactuator 42a and consequent bending of structural element 42b. When structural element 42b is a microactuator, control signals are also applied to microactuator 42b to cause bending complementary to microactuator 42a. Bending of microactuators 42a and 42b is controlled to selectively alter the position of transducing head 41 in the direction of arrows 46, thereby precisely positioning transducing head 41 directly over the selected track on the disc.

FIG. 4 is an enlarged top view of the distal portion of slider 24 illustrating the construction of piezoelectric microactuator 42a according to a first embodiment of the invention. Bottom electrode 50 connects head portion 40 to the remainder of slider 24 across gap 44. Piezoelectric element 52 is formed on bottom electrode 50, and top electrode 54 is formed on piezoelectric element 52. This configuration forms a cantilevered unimorph piezoelectric bending motor, the operation of which is described in detail below with respect to FIGS. 6 and 7.

FIG. 5 is an enlarged top view of the distal portion of slider 24 illustrating the construction of piezoelectric microactuator 42a according to a second embodiment of the invention. Structural layer 60 connects head portion 40 to the remainder of slider 24 across gap 44. Buffer layer 62 is formed on structural layer 60, and adhesive layer 64 is disposed on buffer layer 62. Bottom electrode 66 is formed on adhesive layer 64, and first piezoelectric element 68 is formed on bottom electrode 66. Shared electrode 70 is formed on piezoelectric element 68. A second piezoelectric element 72 is formed on shared electrode 70, and top electrode 74 is formed on piezoelectric element 72. An optional encapsulation layer 76 is formed over top electrode 74. This configuration of piezoelectric microactuator 42a forms a bimorph piezoelectric bending motor, the operation of which is discussed in detail later with respect to FIGS. 8 and 9.

In an exemplary embodiment, structural layer 60 is composed of silicon nitride ($Si_3N_4$) or polysilicon. Buffer layer 62 is preferably composed of silicon dioxide ($SiO_2$) or titanium dioxide ($TiO_2$). Adhesive layer 64 is preferably composed of titanium (Ti) or tantalum (Ta). Bottom electrode 66, shared electrode 70 and top electrode 74 are preferably formed of platinum (Pt). Piezoelectric elements 68 and 72 may be composed of zinc oxide (ZnO), lead zirconium titanate ($PbZrTiO_3$, known as PZT), aluminum nitride (AlN) or polyvinylidene fluoride (PVDF). The zinc oxide material requires no annealing or low temperature annealing, while the PZT material requires high temperature annealing. Piezoelectric elements 68 and 72 may be deposited by sputtering, sol gel techniques or laser deposition, as is known in the art.

FIG. 6 is a diagram of a cantilevered unimorph bending motor 80 in its neutral position, and FIG. 7 is a diagram of cantilevered unimorph bending motor 80 in its actuated position. Unimorph bending motor 80 may be implemented by piezoelectric microactuator 42a described above with respect to FIG. 4. Unimorph bending motor 80 includes bottom electrode 82, piezoelectric element 84 and top electrode 86, and is restrained at one end by connection to a solid object such as slider 24. Terminal 88 connects bottom electrode 82 to a first potential and terminal 90 connects top electrode 86 to a second potential. Piezoelectric element 84 is poled in the direction indicated by arrow 91.

In operation, when the potential difference between terminals 88 and 90 (and consequently between bottom electrode 82 and top electrode 86) is applied across piezoelectric element 84, the element contracts along its length, forcing bending of piezoelectric element 84 and electrodes 82 and 86 as indicated in FIG. 7. In this way, a deflection at the distal tip of bending motor 80 may be achieved. Conversely, application of an opposite potential difference between terminals 88 and 90 across piezoelectric element 84 results in opposite bending and opposite deflection at the distal tip of bending motor 80.

Figure 8:
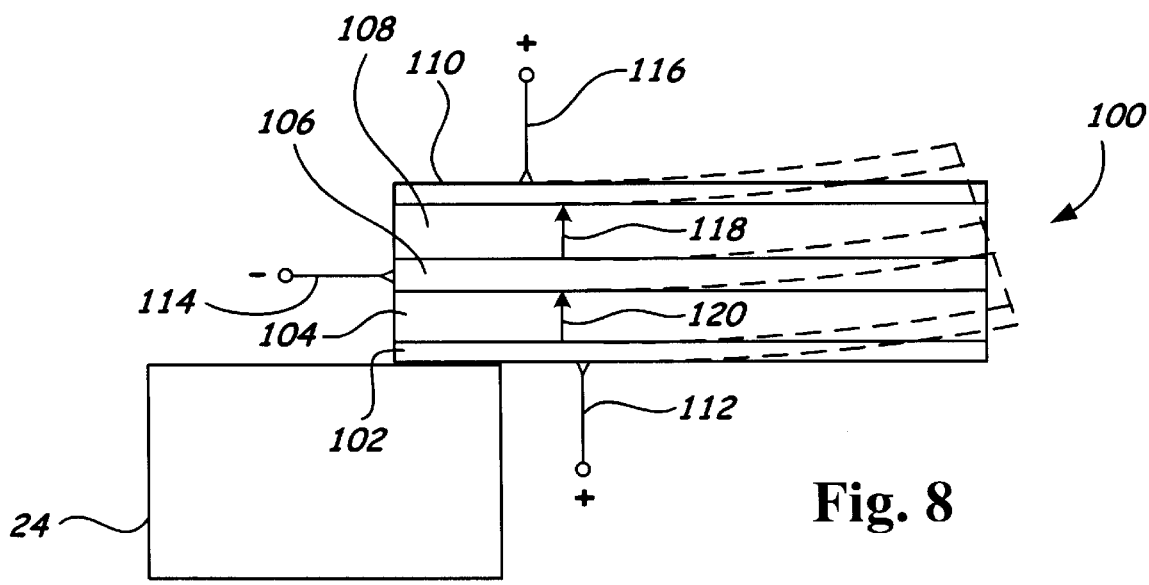
FIG. 8 is a diagram illustrating a bimorph piezoelectric bending motor configured for parallel operation.

FIG. 8 is a diagram illustrating a cantilevered bimorph piezoelectric bending motor 100 configured for parallel operation. Bimorph piezoelectric bending motor 100 may be implemented by piezoelectric microactuator 42a described above with respect to FIG. 5. Bimorph piezoelectric bending motor 100 is restrained at one end by connection to a solid object such as slider 24. Bimorph piezoelectric bending motor 100 includes bottom electrode 102, first piezoelectric element 104, shared electrode 106, second piezoelectric element 108, and top electrode 110. In the "parallel" configuration depicted in FIG. 8, piezoelectric elements 104 and 108 are poled in the direction of arrows 118 and 120. A first voltage is applied at terminal 112 to bottom electrode 102, and at terminal 116 to top electrode 110. A second voltage is applied at terminal 114 to shared electrode 106. Thus, in the "parallel" configuration, piezoelectric element 108 will contract, and piezoelectric element 104 will expand, in response to the first and second voltages applied at the terminals. The result is a bending motion (shown in dashed lines) of bimorph piezoelectric bending motor 100, since one end of the motor is restrained by connection to slider 24. The amount of bending of the motor, and thus the amount of displacement of transducing head 41 on head portion 40 (FIG. 2) is precisely controlled by the voltages applied to terminals 112, 114 and 116. Applying opposite voltages to terminals 112, 114 and 116 causes similar bending in the opposite direction. Thus, bimorph piezoelectric bending motor 100 is able to provide high resolution positioning of head 41 over a selected track of a disc.

Figure 9:
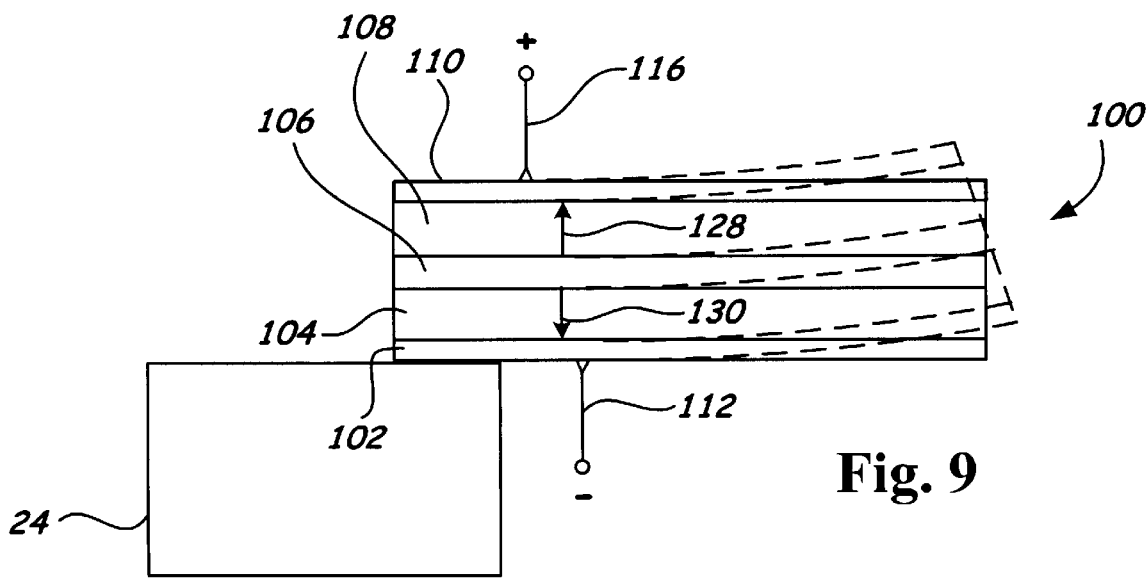
FIG. 9 is a diagram illustrating a bimorph piezoelectric bending motor configured for series operation.

FIG. 9 is a diagram illustrating a cantilevered bimorph piezoelectric bending motor 100 configured for series operation. Bimorph piezoelectric bending motor 100 may be implemented by piezoelectric microactuator 42a described above with respect to FIG. 5. Just as in FIG. 8, bimorph piezoelectric bending motor 100 includes bottom electrode 102, first piezoelectric element 104, shared electrode 106, second piezoelectric element 108, and top electrode 110. Piezoelectric element 108 is poled in the direction of arrow 128 and piezoelectric element 104 is poled in the opposite direction, shown by arrow 130. A first voltage is applied at terminal 116 to piezoelectric element 108, and a second voltage is applied at terminal 112 to piezoelectric element 104. As a result, bimorph piezoelectric bending motor 100 bends as indicated in dashed lines, since one end of the motor is restrained by the connection to slider 24. Applying opposite voltages to terminals 112 and 116 causes similar bending in the opposite direction. The "series" configuration is the simplest and most economical, since it requires only two connections to the outside surfaces of piezoelectric elements 104 and 108. However, the "series" configuration yields less deflection per volt of applied potential than the "parallel" configuration shown in FIG. 8. The "parallel" configuration is more complex, requiring three electrical connections, the additional connection being made to shared electrode 106. Either of the configurations shown in FIGS. 8 and 9 are acceptable for effecting high resolution positioning of transducing head 41 (FIG. 2) over a selected track of a disc.

Figure 10:
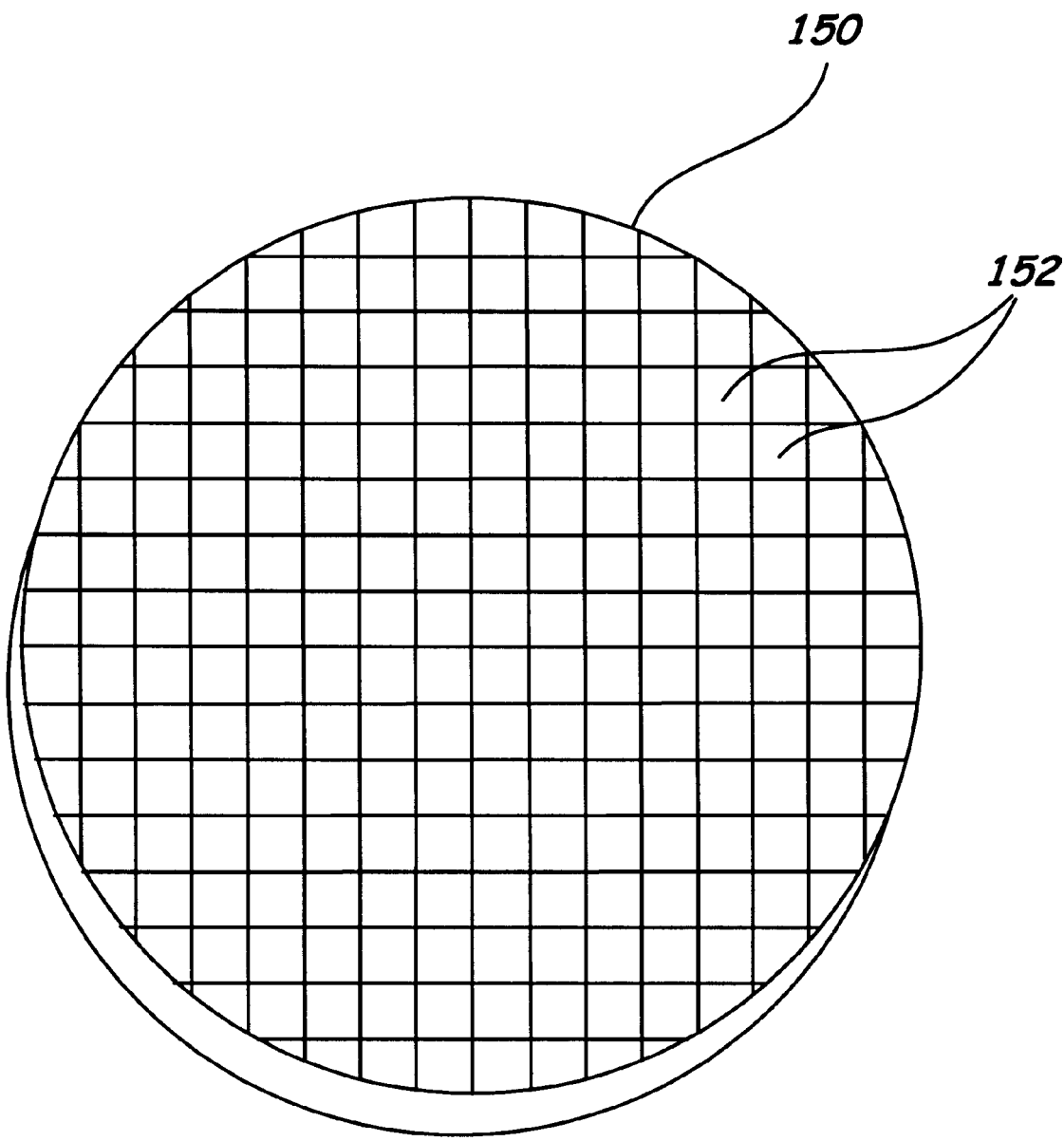
FIG. 10 is a diagram of a typical slider substrate wafer.

FIG. 10 is a diagram of a typical slider substrate wafer 150. Substrate wafer 150 is shown to comprise a plurality of portions 152 used to form a plurality of sliders 24, and has a thickness equal to a desired length of the sliders.

Figure 11:
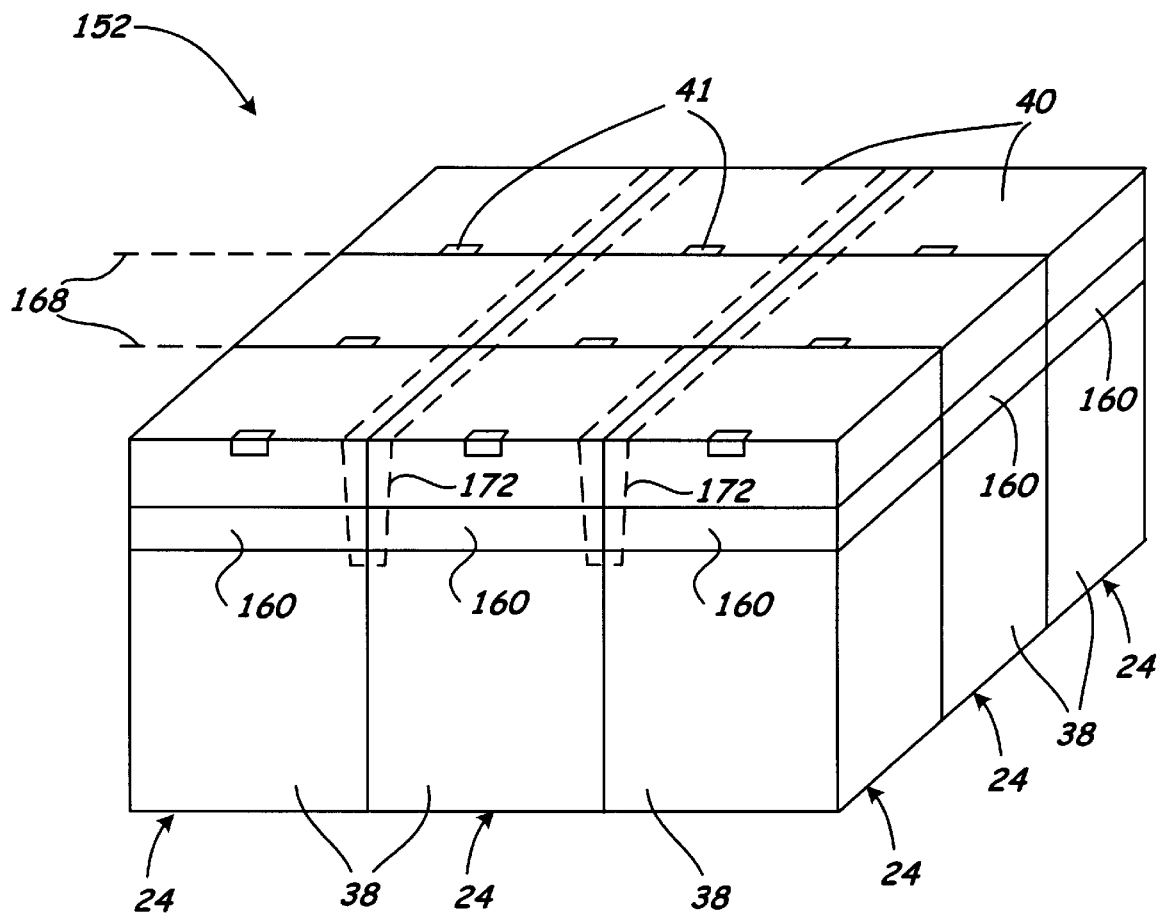
FIG. 11 is a perspective view of a portion of the substrate wafer shown in FIG. 10 in enlarged detail, illustrating a process according to a third embodiment of the present invention.

FIG. 11 is a perspective view of a portion 152 of substrate wafer 150. The portion 152 shows a 3×3 array of sliders 24. Transducing heads 41 are formed on the top (trailing edge) surface of each slider 24 of wafer 150, as is known in the art. The portion 152 further has layers formed thereon according to the present invention. In order to form sliders 24 with a gap between main portions 38 and head portions 40, the substrate wafer is used to define only main portions 38 of sliders 24. Sacrificial layer 160 is deposited on the substrate wafer to define the region that will become the gap.

According to a third embodiment of the present invention, notches 172 are cut between columns of sliders 24 before wafer 150 is cut (along dotted lines 168) into slider rows. After notches 172 have been cut, multilayer piezoelectric microactuators are formed in notches 172. The details of the process of forming the microactuators essentially identical to the process discussed below with respect to FIG. 13, with long strips of materials being formed for several sliders rather than forming individual microactuators for each slider. Wafer 150 is then ready to be diced into slider rows along dotted lines 168, at which point the air-bearing surfaces of sliders 24 are formed.

Figure 12:
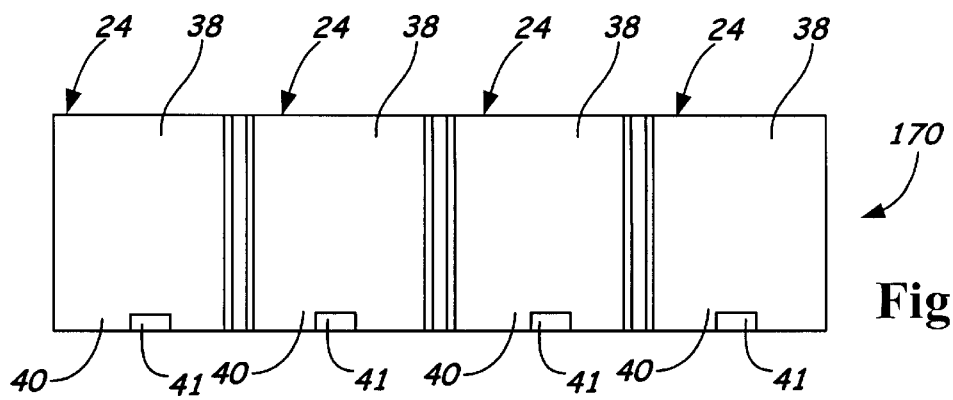
FIG. 12 is a top view of a slider row processed according to a fourth embodiment of the present invention.
Figure 13:
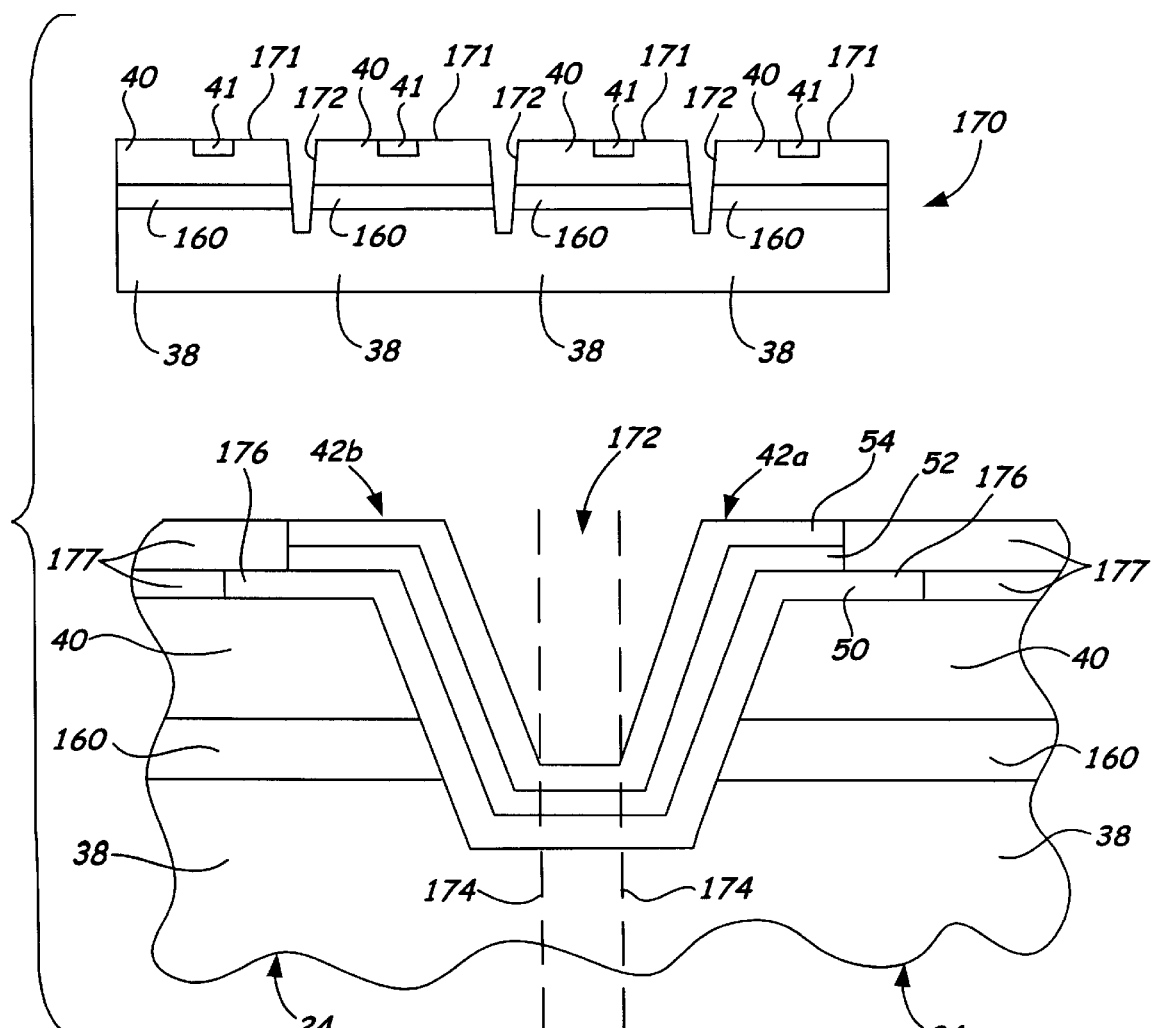
FIG. 13 is a side view of the slider row shown in FIG. 12, with a portion shown in enlarged detail to illustrate the microactuator.

FIG. 12 is a top view, and FIG. 13 is a side view with a portion shown in enlarged detail, of a slider row 170 processed according to a fourth embodiment of the present invention, with structural elements 42b being implemented as microactuators. Slider row 170 includes a plurality of sliders 24 each having an air-bearing surface 171 and notches 172 cut between sliders 24. Notches 172 are shown as trapezoidal in shape, which facilitates sidewall deposition of microactuator layers between sliders; alternatively, notches 172 may be right-angle cuts if more sophisticated sidewall deposition techniques are employed. Notches 172 are cut by a diamond saw, for example, and preferably do not extend through the entire height of sliders 24, so that sliders 24 remain attached to one another in slider row 170.

Microactuators 42a and 42b are formed in notches 172 on opposite sides of sliders 24. Photolithography is performed to define the regions where the electrodes and piezoelectric materials of microactuators 42a and 42b are to be deposited, with photoresist layers 177 being deposited to protect transducing head 41. Bottom electrode 50 is then deposited in notch 172, also extending onto the top surface of sliders 24. Piezoelectric element 52 is deposited and annealed on bottom electrode 50. If high annealing temperatures are required that are incompatible with the materials in transducing heads 41 of sliders 24, annealing may be performed by a localized laser heating process, for example. Preferably, piezoelectric element 52 is composed of a material that does not require annealing temperatures that are incompatible with heads 41. Top electrode 54 is then deposited on piezoelectric element 52, and poling of piezoelectric element 52 is performed at an elevated temperature. Bottom electrode 50 preferably extends on the top surface of sliders 24 beyond piezoelectric element 52 and top electrode 54 at regions 176, to provide easy access to bottom electrode 50 for electrical connection thereto. After bottom electrode 50, piezoelectric element 52 and top electrode 54 have been deposited, photoresist layers 177 used in the photolithography process to define the microactuator regions and protect transducing head 41 are removed and sliders 24 are separated from slider row 170 by dicing at lines 174. Sacrificial layer 160 between main portions 38 and head portions 40 of sliders 24 is also etched away to form the gap between those portions. Electrical connections are made to the microactuator in a manner known in the art, such as through the flex circuit used to contact transducing head 41, and may be made on the top of the slider or on any other exposed surfaces of bottom electrode 50 and top electrode 54. Although microactuators 42a and 42b are only shown in FIG. 13 with bottom electrode 50, piezoelectric element 52 and top electrode 54 (as described above with respect to FIG. 4), it should be understood that microactuators 42a and 42b may be formed to include the layers described above with respect to FIG. 5.

Figure 14:
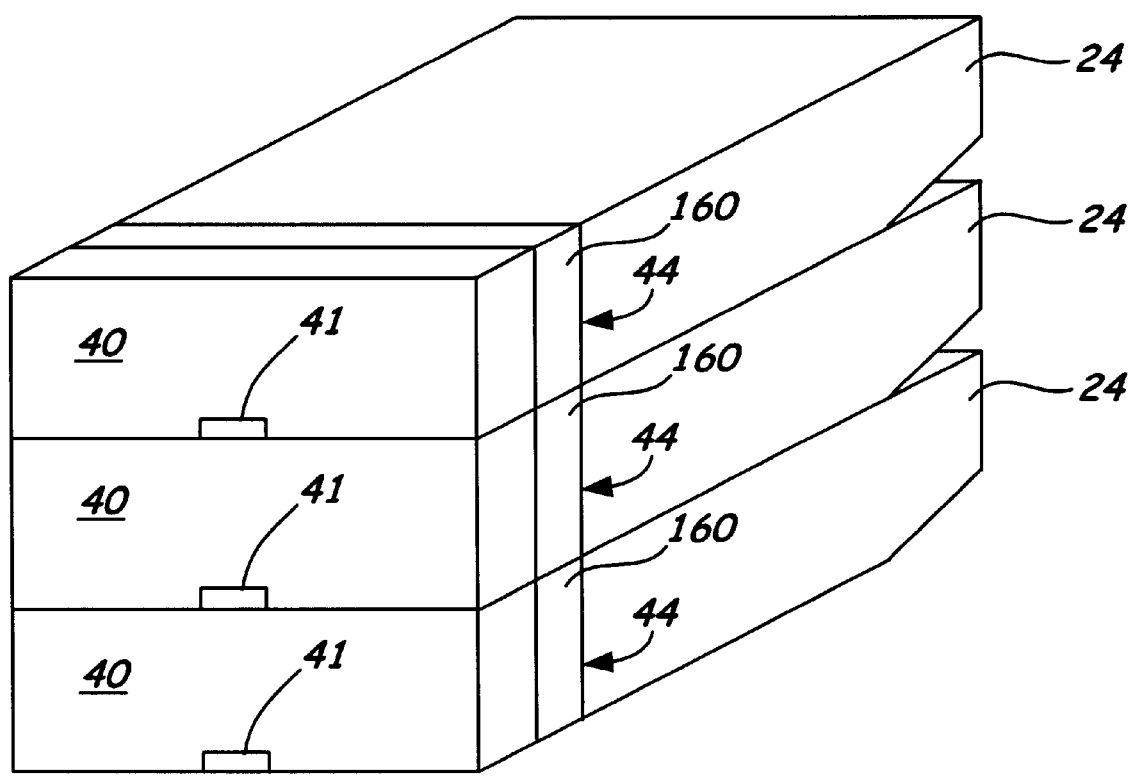
FIG. 14 is a perspective view of a stack of sliders on which to form piezoelectric microactuators according to a fifth embodiment of the present invention.
Figure 15:
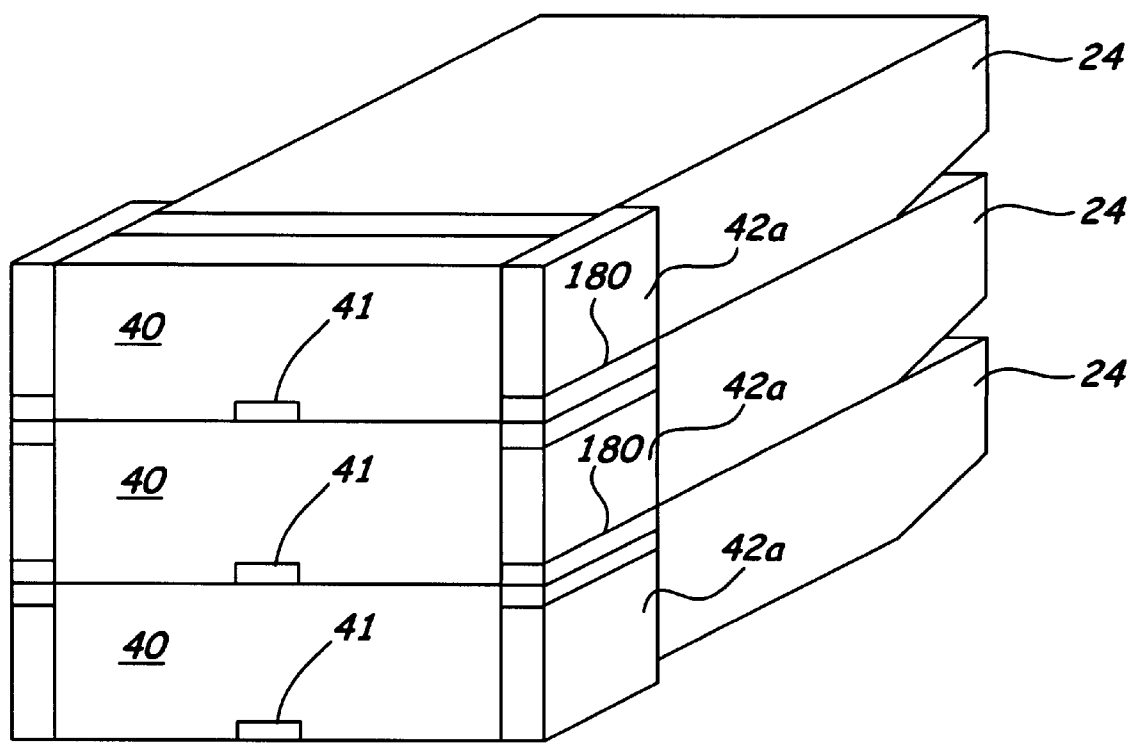
FIG. 15 is a perspective view of the stack of sliders shown in FIG. 10 with piezoelectric microactuators formed thereon according to the fifth embodiment of the present invention.

FIGS. 14 and 15 are perspective views of a stack of sliders 24, illustrating a process of forming microactuator 42a and structural element 42b on sliders 24 according to a fifth embodiment of the present invention. Sliders 24 are each formed as described above with respect to FIGS. 11 and 12 by initially forming main portions 38 of sliders 24, depositing sacrificial layer 160 on the distal surface of main portions 38, and forming head portions 40 on sacrificial layer 160, with head portions 40 carrying transducing heads 41. Sacrificial layer 160 occupies the area that will become gap regions 44 between main portions 38 of sliders 24 and head portions 40. Sliders 24 are diced apart and then stacked and glued together lightly. Piezoelectric microactuator 42a and structural element 42b (which is preferably another microactuator) are either formed directly on slider row assemblies, with the microactuator areas defined by photolithography, for example, on side surfaces of the slider stack, or are separately formed in strips or sheets and then attached to the side surfaces of the slider stack, yielding the structure shown in FIG. 15. Microactuator 42a may be formed on a structural layer (such as layer 60 in FIG. 5) deposited on the side surfaces of the slider stack, or may be formed or attached directly on the side surfaces of the stack. Structural element 42b may be a microactuator similar and complementary to microactuator 42a, or may be a structural layer composed of silicon nitride ($S_3N_4$) or polysilicon, for example. Where the layers of microactuators 42a and 42b are formed as sheets or strips along the side surfaces of the slider stack, the material layers are cut at regions 180 so that microactuators 42a and 42b do not extend all the way to the air-bearing surfaces of sliders 24. In the case where microactuator 42a and structural element 42b are formed on a separate substrate (which is subsequently removed) and attached to the slider stack, the multilayer sheets are ultimately separated into individual microactuators on each of the sliders 24 by a laser, for example. This separate formation and transfer process avoids potential temperature incompatibilities, since the potentially high temperature annealing of the piezoelectric material is not performed proximate to transducing head 41. Sacrificial layer 160 is then etched away to form gaps 44 between the main portions of sliders 24 and head portions 40 of the sliders. The glue holding sliders 24 together is then dissolved, leaving each individual slider with piezoelectric microactuator 42a and structural element 42b on its side surfaces across gap 44. Alternatively, the process described above could be performed on each slider individually, thereby increasing the number of steps involved to attach the microactuators to the sliders but eliminating the steps of initially gluing the sliders together, separating the microactuators and ultimately dissolving the glue to separate the sliders.

The present invention provides precise, high performance head positioning, with high acceleration in moving the head and sufficiently large and accurate head displacement to cover several data tracks. Only head portion 40 of slider 24 is moved by microactuator 42a (and structural element 42b, when it is implemented as a microactuator), minimizing the total mass that is displaced and thereby enabling high acceleration of head 41. Additionally, moving only head portion 40 of slider 24 allows the microactuator to cancel resonance effects associated with the actuator arm and flexure, eliminating any track misregistration effects due to vibrations or the like resulting from those resonances. The microactuators are also readily manufacturable by simple existing fabrication techniques with only the addition of a sacrificial layer on the slider, minimizing the incremental cost of the microactuator-equipped disc drive.

Although the present invention has been described with reference to preferred embodiments, workers skilled in the art will recognize that changes may be made in form and detail without departing from the spirit and scope of the invention.

What is claimed is:

1. A disc drive slider and transducing head assembly for selectively altering a position of the transducing head with respect to a track of a rotatable disc having a plurality of concentric tracks, comprising:

a slider body having a discrete main portion and a discrete head portion separated by a gap, the head portion carrying the transducing head, the slider body being arranged to be supported by a support structure over a surface of the rotatable disc; and means for connecting the head portion to the main portion of the slider body and for selectively altering the position of the head portion with respect to the main portion of the slider body.

2. A disc drive slider and transducing head assembly for selectively altering a position of the transducing head with respect to a track of a rotatable disc having a plurality of concentric tracks, comprising:

a slider body having a discrete main portion and a discrete head portion separated by a gap, the head portion carrying the transducing head, the slider body being arranged to be supported by a support structure over a surface of the rotatable disc; and a pair of structural elements on opposite side surfaces of the slider body between the main portion and the head portion across the gap, at least one of the structural elements being a microactuator responsive to electrical control signals to selectively bend to alter the position of the head portion with respect to the main portion of the slider body.

3. The slider assembly of claim 2, wherein the microactuator comprises:

a bottom electrode;

a piezoelectric element on the bottom electrode; and a top electrode on the piezoelectric element.

4. The slider assembly of claim 2, wherein the microactuator comprises:

a bottom electrode;

a first piezoelectric element on the bottom electrode;

a shared electrode on the first piezoelectric element;

a second piezoelectric element on the shared electrode; and a top electrode on the second piezoelectric element.

5. The slider assembly of claim 4, wherein the microactuator further comprises:

a structural layer on one of the side surfaces of the slider body; and an adhesive layer on the structural layer, the structural layer and the adhesive layer supporting the bottom electrode.

6. The slider assembly of claim 5, wherein the microactuator further comprises:

a buffer layer between the structural layer and the adhesive layer.

7. The slider assembly of claim 4, wherein the microactuator further comprises:

an encapsulation layer over the top electrode.

8. The slider assembly of claim 2, wherein each of the pair of structural elements is a microactuator responsive to electrical control signals to selectively complementarily bend to alter the position of the head portion with respect to the main portion of the slider body.

9. The slider assembly of claim 8, wherein each of the microactuators comprises:

a bottom electrode;

a piezoelectric element on the bottom electrode; and a top electrode on the piezoelectric element.

10. The slider assembly of claim 8, wherein each of the microactuators comprises:

a bottom electrode;

a first piezoelectric element on the bottom electrode;

a shared electrode on the first piezoelectric element;

a second piezoelectric element on the shared electrode; and a top electrode on the second piezoelectric element.

11. The slider assembly of claim 10, wherein each of the microactuators further comprises:

a structural layer on one of the side surfaces of the slider body; and an adhesive layer on the structural layer, the structural layer and the adhesive layer supporting the bottom electrode.

12. The slider assembly of claim 11, wherein each of the microactuators further comprises:

a buffer layer between the structural layer and the adhesive layer.

13. The slider assembly of claim 10, wherein each of the microactuators further comprises:

an encapsulation layer over the top electrode.

* * * * *